(12) United States Patent
Hosono

(10) Patent No.: US 7,016,230 B2
(45) Date of Patent: Mar. 21, 2006

(54) NON-VOLATILE SEMICONDUCTOR MEMORY DEVICE

(75) Inventor: Koji Hosono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/867,679

(22) Filed: Jun. 16, 2004

(65) Prior Publication Data
US 2005/0078524 A1    Apr. 14, 2005

(30) Foreign Application Priority Data
Oct. 9, 2003    (JP)    ............... 2003-351068

(51) Int. Cl.
*G11C 16/04*    (2006.01)
(52) U.S. Cl. .................. 365/185.17; 365/185.21; 365/185.33
(58) Field of Classification Search ........... 365/185.17, 365/185.21, 185.29, 185.33, 189.05, 149, 365/189.06
See application file for complete search history.

(56) References Cited

U.S. PATENT DOCUMENTS 6,140,847 A * 10/2000 Le Campion ............... 327/111
6,373,746 B1    4/2002 Takeuchi et al.
2002/0126531 A1    9/2002 Hosono et al.
2002/0171502 A1 * 11/2002 Partridge et al. .......... 333/17.1
2003/0133338 A1 * 7/2003 Kanda et al. ............... 365/200
2004/0109357 A1 * 6/2004 Cernea et al. .......... 365/185.21
2005/0024939 A1 * 2/2005 Chen et al. ............. 365/185.17

FOREIGN PATENT DOCUMENTS

JP    2001-167590    6/2001

* cited by examiner

*Primary Examiner*—Anh Phung
*Assistant Examiner*—Dang T. Nguyen
(74) *Attorney, Agent, or Firm*—Oblon, Spivak, McClelland, Maier & Neustadt, P.C.

(57) ABSTRACT

A non-volatile semiconductor memory device including a memory cell array with electrically rewritable and non-volatile memory cells arranged therein, and a sense amplifier circuit for reading said memory cell array, wherein the sense amplifier circuit includes: a first transistor disposed between a bit line of the memory cell array and a sense node to serve for sensing bit line data, the first transistor being driven by a voltage generating circuit including a boost circuit to transfer a bit line voltage determined in response to data of a selected memory cell to the sense node; a second transistor coupled to the sense node for precharging the sense node prior to bit line data sensing; a data latch for judging a transferred bit line voltage level to store a sensed data therein; and a capacitor for boosting the sense node, one end thereof being connected to the sense node, the other end thereof being selectively driven by a boost-use voltage.

28 Claims, 13 Drawing Sheets

NON-VOLATILE SEMICONDUCTOR MEMORY DEVICE

CROSS-REFERENCE TO RELATED APPLICATION

This application is based on and claims the benefit of priority from the prior Japanese Patent Application No. 2003-351068, filed on Oct. 9, 2003, the entire contents of which are incorporated herein by reference.

BACKGROUND OF THE INVENTION

1. Field of the Invention

This invention relates to an electrically rewritable and non-volatile semiconductor memory device (EEPROM).

2. Description of Related Art

A cell array of a NAND-type flash memory, which is known as an EEPROM, is formed of NAND cell units arranged therein, each NAND cell unit having plural memory cells connected in series. One end of each NAND cell unit is connected to a bit line, and the other to a source line. Control gates of the memory cells in the NAND cell unit are connected to different word lines.

In such the NAND type flash memory, since plural memory cells are connected in series in such a manner that each source/drain is shared with adjacent two memory cells, and bit line contacts and source line contacts are shared with plural memory cells, it is possible to achieve a small unit cell size. In addition, it is suitable for miniaturizing the memory chip that word lines and device regions are formed with substantially simple stripe patterns in the cell array, whereby large capacitive flash memories have already been achieved.

Further, data write or erasure of the NAND type flash memory may be performed by simultaneously causing many cells to flow FN tunneling current. In detail, supposing that a group of memory cells sharing a word line serves as one page or two pages, data write is done by a page. Data erasure is done by a block which is defined as a group of NAND cell units sharing word lines and select gate lines. On the other hand, one page data are serially transferred between a sense amplifier circuit, which stores one page read or write data, and an I/O terminal. Due to these specifications, NAND flash memories have already been accepted in the market as having an excellent performance for use of storing in a non-volatile manner large capacitive and continuous data such as still image, moving image, music data and the like.

With respect to the block erasure of the NAND type flash memory, it is necessary to do verify-read (i.e., erase-verify) for verifying an erase state in which the threshold voltages of selected memory cells have been shifted into a predetermined threshold range. It has already been proposed an erase-verify scheme in which a NAND cell unit current is carried from the source line to the bit line (for example, refer to Japanese Patent Application Laid Open No. 2003-249083).

Such a method will be explained in detail below. In the NAND flash memory, binary data is usually defined by a negative threshold state serving as a "1" data (erase state), and a positive threshold state serving as a "0" data (write state). To verify that memory cells in an erased block are in a threshold state of $Vt=-1V$, apply 0V to the entire word lines in the block, and apply a power supply voltage Vdd to the source line after having precharged the bit line to 0V. Applied to the select gate lines is a voltage necessary for making the select gate transistors being in a deeply on state.

If all memory cells in the NAND cell unit have been erased to have a threshold voltage Vt equal to or lower than −1V, the channel current flows to charge and boost the bit line to $Vg-Vt'=0V-(-1V)=1V$. While Vt' is a threshold voltage of the memory cell in consideration of a substrate bias effect, it is assumed to be $Vt=Vt'$ here for simplifying the explanation. If there is at least one memory cell, threshold of which is not reduced to −1V (i.e., the memory cell is not sufficiently erased), the bit line voltage is not boosted. Therefore, detect the bit line voltage by the sense amplifier circuit, and it is possible to verify the erase state of the NAND cell unit.

A conventional sense amplifier circuit used in NAND-type flash memories is configured to have precharge circuit for precharging a sense node and a bit line, clamping transistor disposed between the sense node and the bit line to clamping the bit line precharge level, and data latch with a clocked inverter for detecting bit line voltage transferred to the sense node. It has already been proposed a sense amplifier circuit with a boost capacitor connected to the sense node for increasing the sense margin (for example, refer to Japanese Patent Application Laid Open No. 2001-325796).

In the above-described erase-verify scheme adapted to a NAND type flash memory with the conventional sense amplifier, there is a problem that it is difficult to secure a large verify margin. Especially in recent years, it is strongly required to lower the power supply voltage of memories. In practice, a low power supply voltage, such as Vdd=1.8V, is going to be used in memories. Using such the low power supply voltage, the erase-verify margin becomes further smaller.

SUMMARY OF THE INVENTION

According to one aspect of the present invention, there is provided a non-volatile semiconductor memory device including a memory cell array with electrically rewritable and non-volatile memory cells arranged therein, and a sense amplifier circuit for reading said memory cell array, wherein the sense amplifier circuit includes:

a first transistor disposed between a bit line of the memory cell array and a sense node to serve for sensing bit line data, the first transistor being driven by a voltage generating circuit including a boost circuit to transfer a bit line voltage determined in response to data of a selected memory cell to the sense node;

a second transistor coupled to the sense node for precharging the sense node prior to bit line data sensing;

a data latch for judging a transferred bit line voltage level to store a sensed data therein; and a capacitor for boosting the sense node, one end thereof being connected to the sense node, the other end thereof being selectively driven by a boost-use voltage.

DETAILED DESCRIPTION OF THE EMBODIMENTS

Illustrative embodiments of this invention will be explained with reference to the accompanying drawings below.

Figure 1:
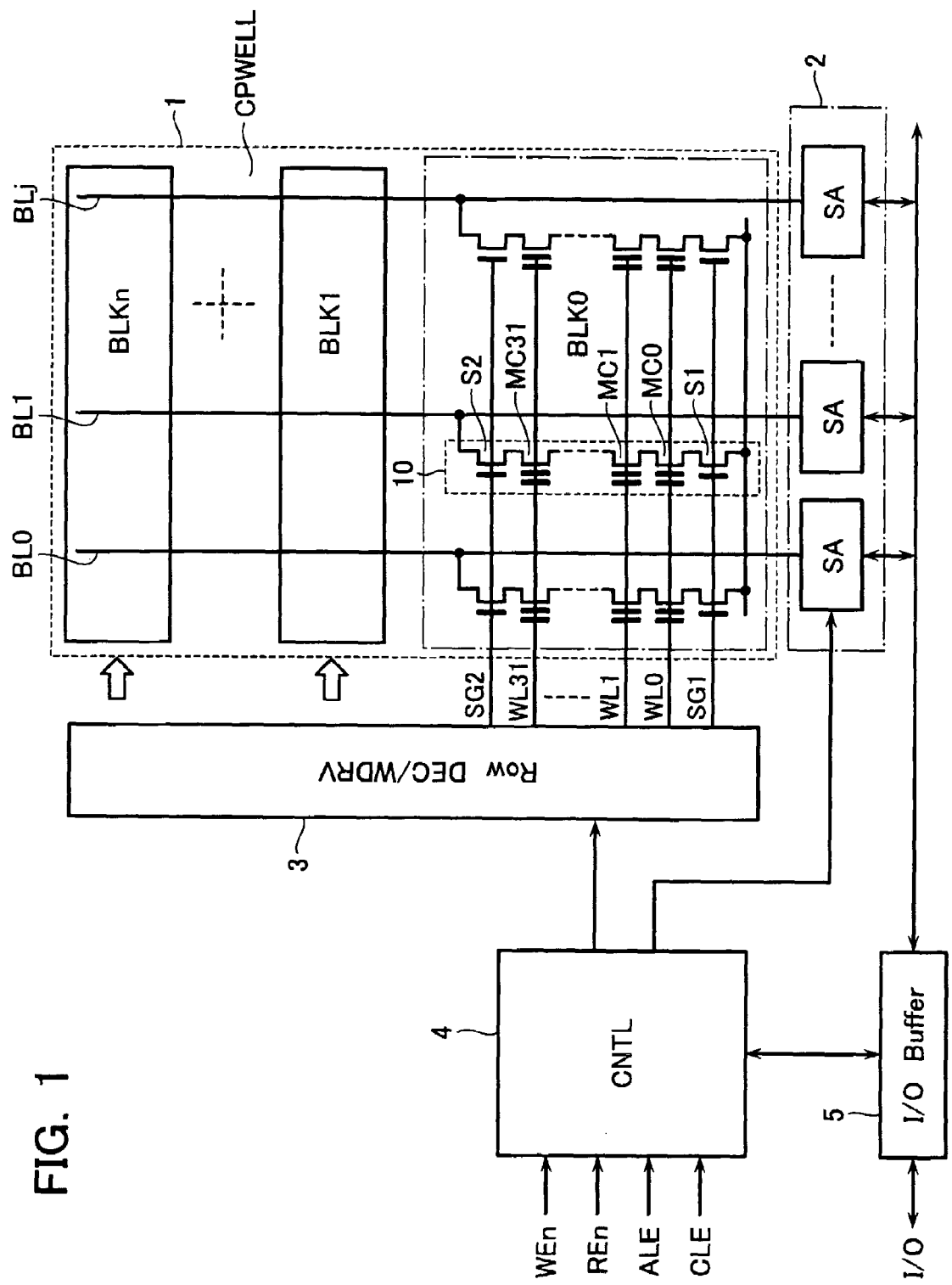
FIG. 1 shows a configuration of a flash memory in accordance with an embodiment of the present invention.

FIG. 1 shows a brief configuration of a NAND-type flash memory in accordance with an embodiment. A memory cell array 1 is formed of NAND cell units 10 which are arranged in a matrix manner. One NAND cell unit 10 has plural memory cells MC (MC0, MC1, . . . , MC31) connected in series and select gate transistors S1 and S2 connected to the respective ends thereof. The source of select gate transistor S1 is coupled to a source line CELSRC, and the drain of select gate transistor S2 to a bit line BL.

The respective control gates of the memory cells in a NAND cell unit 10 are coupled to different word lines WL (WL0, WL1, . . . , WL31). Gates of the select gate transistors S1 and S2 are coupled to select gate lines SG1 and SG2, respectively, disposed in parallel with the word lines WL. A group of plural memory cells sharing a word line is defined as one page or two pages. A group of plural NAND cell units 10 sharing word lines WL and select gate lines SG1 and SG2 is defined as a block which serves as a unit of data erasure.

As shown in FIG. 1, memory cell array 1 has a plurality of blocks BLK (BLK0, BLK1, . . . , BLKn) arranged in the direction of the bit line BL. This memory cell array 1 with plural blocks is formed on a cell well (CPWELL) of a silicon substrate.

Connected to the bit lines BL of the memory cell array is a sense amplifier circuit 2 which serves as a page buffer with plural sense amplifiers SA for sensing cell data and storing write data. The sense amplifier circuit 2 has column select gates. Row decoder (including word line driver) 3 is disposed for selecting and driving word lines and select gate lines.

Data I/O buffer 5 is disposed to transfer data between the sense amplifier circuit 2 and external I/O terminals, and receive command and address data. Controller 4 controls the entire memory operations in response to external control signals such as write enable signal WEn, read enable signal REn, address latch enable signal ALE, command latch enable signal CLE and the like.

In detail, the controller 4 includes command interface and address hold/transfer circuit, and judges whether supplied data is write data or address data. In accordance with the judged result, write data is transferred to the sense amplifier circuit 2, and address data to the row decoder 3 and sense amplifier circuit 2. In addition, the controller 4 executes sequence controls of data write and erase, and controls of data read in response to the external control signals.

Figure 2:
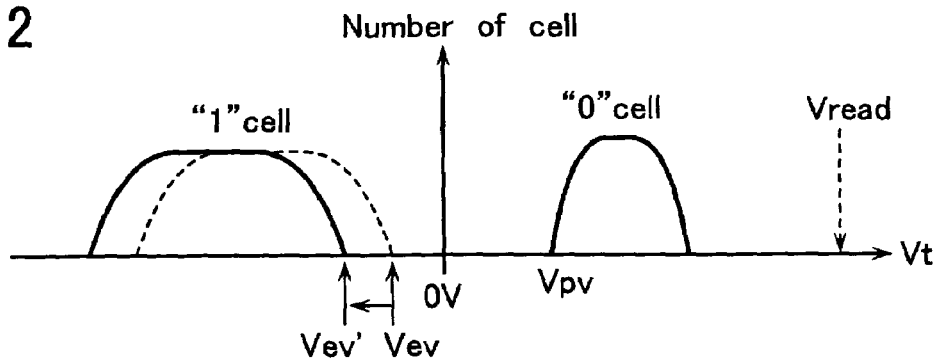
FIG. 2 shows binary data threshold distributions of the flash memory.

FIG. 2 shows a relationship between stored data and threshold voltages of memory cell MC. In case of binary data storing, a negative threshold state of memory cell is defined as logic "1" data, and a positive threshold state as logic "0" data. An operation for causing a memory cell to store "1" data is referred to as an "erase" operation, and an operation for causing a memory cell to store "0" data as a "write" operation in a narrow sense. Data erasure of the NAND-type flash memory is usually performed by a block.

Figure 3:
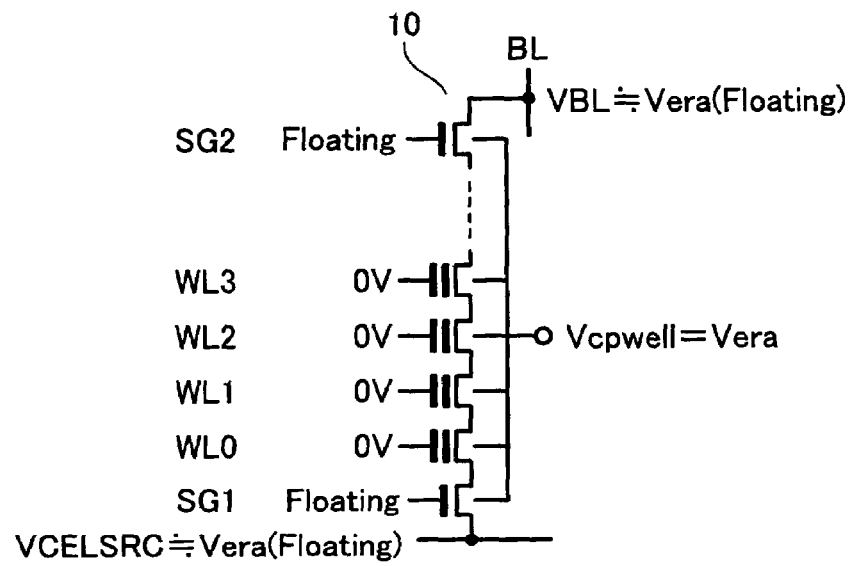
FIG. 3 shows a bias condition with respect to a NAND cell unit at an erase time of the flash memory.

FIG. 3 shows a voltage relationship at an erase time by taking note of one NAND cell unit. As shown in FIG. 3, an erase voltage Vera (approximately equal to 20V) is applied to the cell well (CPWELL), and 0V to the entire word lines WL. With this voltage application, electrons charged on the floating gates of all memory cells are drawn out by FN tunneling, whereby these cells become depletion-type. At this time, to prevent the gate insulating films of the select gate transistors S1 and S2 from being destroyed, the select gate lines SG1 and SG2 are set in a floating state. The bit line BL and source line CELSRC also are set in a floating state.

A write operation is performed by a page. At a write time, a write voltage Vpgm (approximately equal to 20V) is applied to a selected word line; an intermediate voltage Vpass (approximately equal to 10V) to non-selected word lines; and Vdd to select gate lines SG1 and SG2.

Prior to such the write operation, the bit line and NAND cell unit are precharged in accordance with write data. In detail, in case of data "0" write, 0V is applied to the bit line from the sense amplifier circuit 2. This bit line voltage is transferred to the channel of a selected memory cell coupled to a selected word line via the select gate transistor and non-selected memory cells. Therefore, on the above-described bias condition, electrons are injected from the channel into the floating gate of the selected cell, whereby cell threshold is shifted in the positive direction.

In case of "1" write (write inhibition, i.e., "0" data is not written), Vdd is applied to the bit line. This bit line voltage is transferred to the NAND cell channel with decreasing by the threshold voltage of the select gate transistor S2, resulting in that the channel is in a floating state. Therefore, with the voltage application such as above-described write voltage Vpgm and pass voltage Vpass, the channel being boosted by capacitive coupling, electron injection into the floating gate is not generated, resulting in that the memory cell is held in the "1" data state.

Data read is performed by applying a read voltage, 0V, to a selected word line, and detecting whether memory cell current flows or not to judge data by the sense amplifier circuit 2. At this time, to assure of data reliability, it is necessary to secure a margin between the threshold voltage of the memory cell and the read voltage. Therefore, in the data erase and data write modes, it is required to control the lowermost threshold Vpv of "0" data and the uppermost threshold Vev of "1" data as shown in FIG. 2.

For the purpose of the above-described threshold control, in the erase mode, a verify-read (i.e., erase-verify) is performed after having performed the above-described erase voltage application for verifying that the erased cell's threshold voltage is equal to or lower than the uppermost value Vev of the threshold distribution. In the data write mode, after having applied the write voltage pulse, verify-read (write-verify) is performed for verifying that the "0" write cell's threshold voltage is equal to or higher than the lowermost value Vpv of the threshold distribution.

Figure 4:
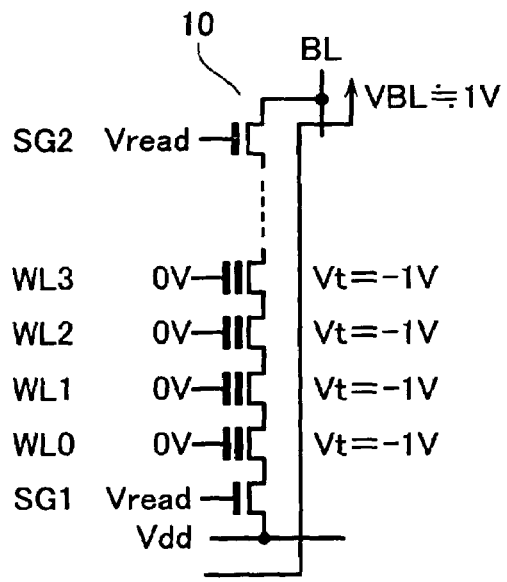
FIG. 4 shows a bias condition with respect to a NAND cell unit at an erase-verify time of the flash memory.

Take note of the erase-verify here. A voltage relationship in an NAND cell unit at the erase-verify read time is shown in FIG. 4. Vdd is applied to the cell source line CELSRC; 0V to the entire word lines in the selected block; and an intermediate voltage Vread (approximately equal to 4.5V) higher than the power supply voltage Vdd to the select gate lines SG1 and SG2. The bit line BL is precharged at 0V.

If all memory cells in the NAND cell unit shown in FIG. 4 have been erased to be in a "1" state in which the threshold voltage Vt is −1V(=Vev), a voltage of about 1V, that is equivalent to an absolute value of the memory cell's threshold voltage, is generated at the bit line at the above-described verify-read time. Therefore, to set the uppermost value Vev of "1" data threshold shown in FIG. 2 at −1V, it may be designed to detect that the bit line voltage is equal to or higher than 1V by the sense amplifier circuit 2. When bit line voltage is detected to be equal to or higher than 1V, as it should be judged that the entire memory cells in the NAND cell unit has been sufficiently erased, the erase operation ends off. If the bit line voltage is detected as being lower than 1V, as it should be judged that there is at least one memory cell insufficiently erased, the erase voltage pulse is applied again.

Figure 5:
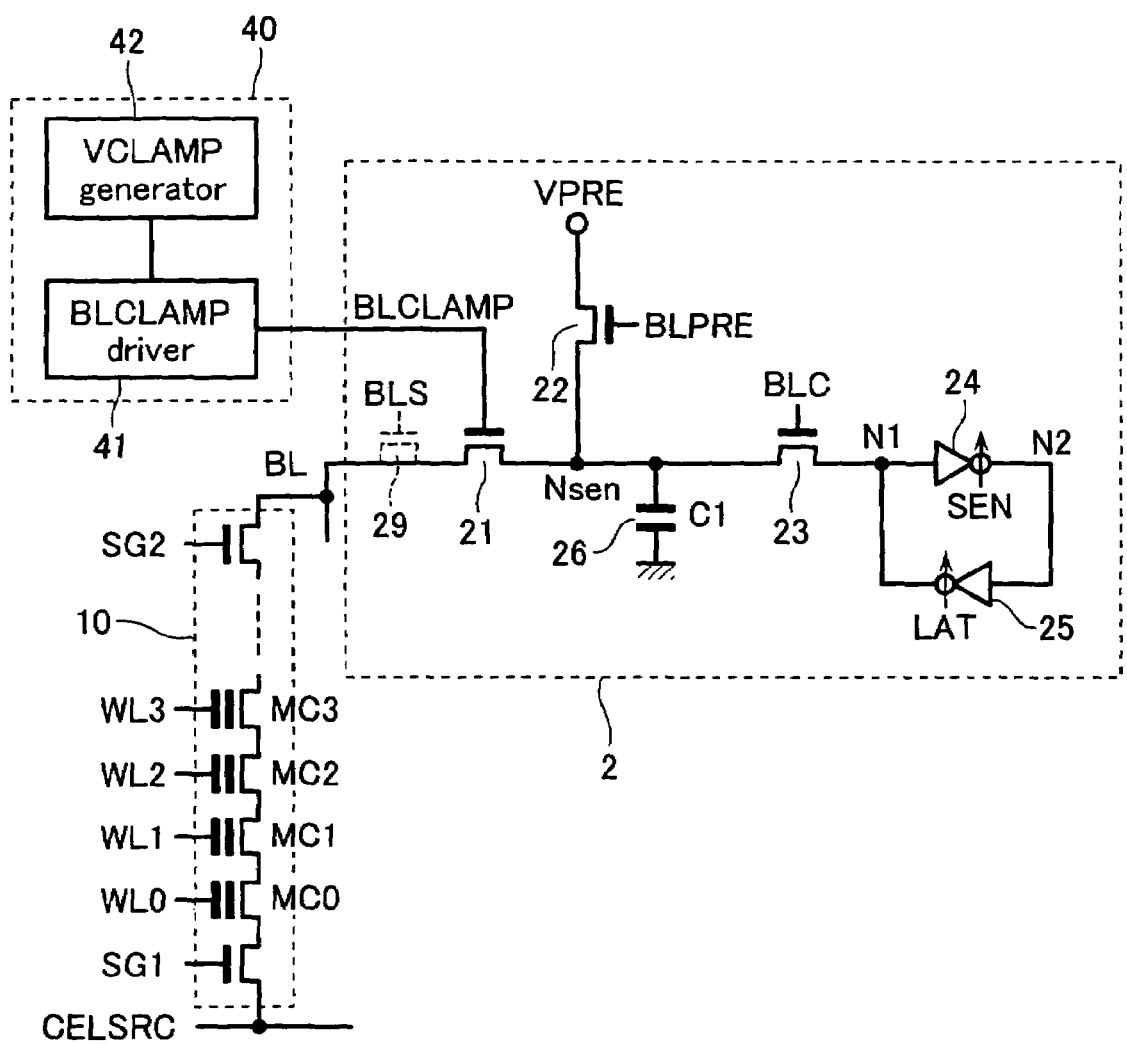
FIG. 5 shows main portions of a sense amplifier circuit of a conventional NAND flash memory.

FIG. 5 shows a configuration of the sense amplifier circuit 2 with respect to circuit portions with relation to the erase-verify operation. The sense amplifier circuit 2 has a data latch consisting of clocked inverters 24 and 25 connected with reversed polarities in parallel with each other. One node N1 within two data nodes N1 and N2 of the data latch serves as a node to which bit line data is transferred. This node N1 is connected to a sense node Nsen through a transferring NMOS transistor 23. The sense node Nsen is connected to a bit line BL through a clamping NMOS transistor 21. This clamping transistor 21 serves for clamping the bit line voltage and serves as a pre-sensing amplifier. Further connected to this sense node Nsen is a precharging NMOS transistor 22 for precharging the sense node Nsen and bit line BL.

In an erase mode, a high voltage approximately equal to an erase voltage is applied to the bit line BL. Therefore, in case that the clamping transistor 21 is not such a high breakdown voltage one as being able to withstand the above-described high voltage, an NMOS transistor 29 with a high breakdown voltage is disposed between the bit line BL and the clamping transistor 21 as shown by a dotted line. This transistor 29 serves as a bit line select transistor in case that the sense amplifier circuit 2 is shared with two bit lines.

To control the gate BLCLAMP of the clamp-use transistor 21, there is prepared a clamp voltage generating circuit 40. This circuit 40 has a voltage generator 42 for generating a clamp voltage Vclamp and a driver 41 for driving the transistor 21 with the clamp voltage.

Figure 6:
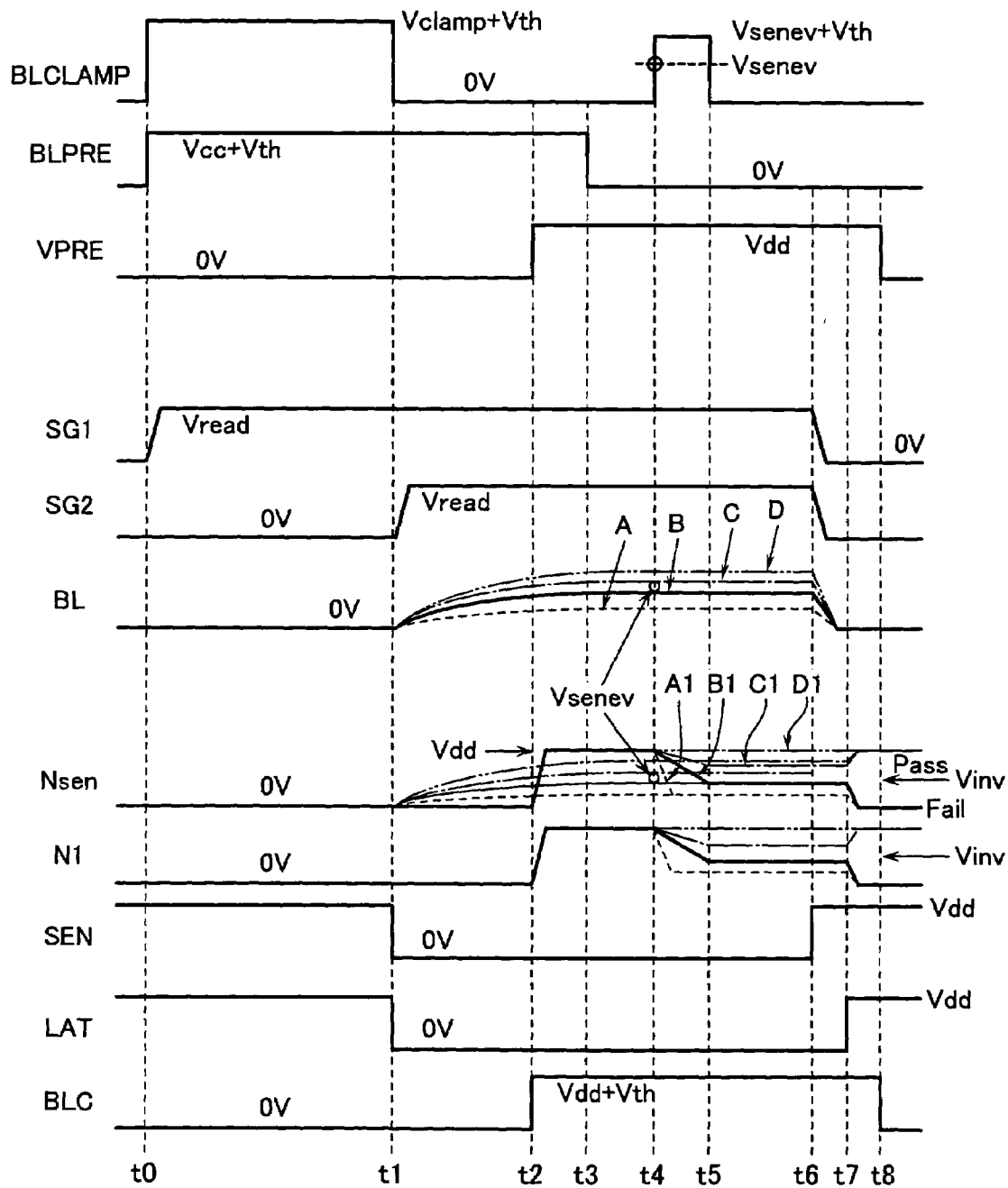
FIG. 6 shows a timing chart of an erase-verify operation with the sense amplifier circuit.

FIG. 6 shows a timing chart of a normal erase-verify operation with such the sense amplifier circuit 2. The erase-verify starting at timing t0, Vclamp+Vth (Vth is threshold of a NMOS transistor) is applied to the gate BLCLAMP of the clamp transistor 21; Vdd to the gate BLPRE of the precharge transistor 22; and 0V to the drain VPRE (voltage supply node) of the transistor 22. With this voltage application, the transistors 21 and 22 become on, whereby bit line BL is set as at 0V.

Here, the gate BLCLAMP is controlled by the voltage driver 41, which outputs a voltage generated from the voltage generator 42 to the gate BLCLAMP in accordance with an event presently selected. In a selected block, 0V is applied to the entire word lines, and the intermediate voltage Vread to the source line side select gate line SG1. At this time, the bit line side select gate line SG2 is held at 0V.

The transistor 21 turning off at timing t1, the bit line precharge operation is stopped. Then, the intermediate voltage Vread being applied to the select gate line SG2, cell current defined in response to the cell threshold flows in the NAND cell unit from the source line CELSRC toward the bit line BL, thereby beginning to charge the bit line BL. At the same time, the clocked inverters 24 and 25 of the dada latch are set at high output impedance (HiZ) states. FIG. 6 indicates four cases with bit line charging curves A, B, C and D defined in response to the erased cells' threshold in the NAND cell unit.

As the node VPRE becomes Vdd at timing t2, the sense node Nsen is charged up to Vdd. At the same time, as Vdd is applied to the gate BLC of the transistor 23 to turn on it, the data node N1 also is charged to Vdd.

The transistor 22 turning off at timing t3, the sense node Nsen and data node N1 become to be in a floating state of Vdd. To retain the precharged voltage of these nodes, a capacitor 26 is connected to the sense node Nsen.

During timings t4–t5, applied to the gate BLCLAMP of the clamping transistor 21 is a sense-use voltage Vsenev+Vth. As a result, a bit line data sense operation is performed in a way that the transistor 21 transfers the bit line voltage, which has been changed in response to the cell data, to the sense node Nsen. Note here, Vsenev is such a data judging value that if bit line voltage VBL is below it, the clamp transistor 21 becomes on, and when bit line voltage VBL is above it, the clamp transistor 21 becomes off. This data judging value Vsenev is ideally set at an absolute value |Vev| of the uppermost threshold Vev of data "1" as shown in FIG. 2. In practice, however, in consideration of the substrate bias effect of the memory cell, the judging value Vsenev is set as being lower than |Vev|.

In case that bit line voltage VBL is low as shown by curve A, the gate-source voltage, Vsenev+Vth−VBL, of the clamp transistor 21 is higher than the threshold voltage Vth. Therefore, the transistor 21 becomes on, thereby discharging the stored charge of the sense node Nsen toward the bit line. As a result, the voltage of the sense node Nsen lowers to be approximately equal to that of the bit line BL (refer to curve A1). In case that bit line voltage VBL is slightly lower than Vsenev at timing t4 as shown by curve B, the gate-source voltage, Vsenev+Vth−VBL, of the clamp transistor 21 is higher than the threshold voltage Vth as well as the case of curve A. Therefore, the transistor 21 becoming on, the voltage of the sense node Nsen lowers to VBL from Vdd (refer to curve B1).

On the contrary, as shown by curve C, in case that the bit line voltage is slightly higher than Vsenev at timing t4, the gate-source voltage, Vsenev+Vth−VBL, of the clamp transistor 21 is lower than the threshold voltage Vth. Therefore, the transistor 21 is off. At this time, the voltage of the sense node Nsen is slightly lowered from Vdd due to the sub-threshold current of the transistor 21 (refer to curve C1). In case that the bit line voltage is sufficiently high, as the transistor 21 is held in a deeply-off state, the voltage of the sense node Nsen is hardly changed and held at Vdd as it is (refer to curve D1).

Letting the sense signal SEN be "H" at timing t6, after having turned off the transistor 21 at timing t5, the clocked inverter 24 is activated to drive the data node N2. At this time, if the voltage of node N1 is lower than the inverting threshold value of the clocked inverter 24, the node N2 becomes "H". If not so, the node N2 becomes "L". In detail, when bit line voltage is higher than a certain level, and the node N2 becomes "L", it is judged that memory cells in the NAND cell unit have been erased in a threshold state lower than the uppermost value Vev, resulting in that this erase-verify becomes "PASS".

Letting a latch signal LAT be "H" at timing t7, the clocked inverter 25 is activated, whereby clocked inverters 24 and 25 latch the sensed data. The remaining signals are returned to the initial states at timing t8, resulting in the erase-verify end.

As stated above, it is possible to check whether the entire memory cells in a NAND cell unit have been erased to be lower than a certain threshold value or not. The judging value is determined by the voltage applied to the gate BLCLAMP of the clamp transistor 21 and the inverting threshold value of the clocked inverter 24. To assure that memory cell's threshold is equal to or lower than Vev=–Vsenev, it is required of the clocked inverter 24 to judge the state that Vsenev is retained at the node N1 after timing t5 as a "L" input. In other words, it is required that Vsenev is lower than the inverting threshold voltage of the inverter 24. Unfortunately, the inverting threshold voltage of the clocked inverter is influenced by the power supply voltage Vdd, and the transistor threshold voltage Vth or the like to be variously changed. Further, as described above, the power supply voltage of Vdd=1.8V is going to be used in practice. Assuming that the inverting threshold voltage of the clocked inverter is about 0.7V, and the above-described low power supply voltage is used, it is necessary for setting the judging value Vsenev to be lower than 0.7V in the above-described erase-verify scheme, resulting in that the erase-verify margin in the judgment of a negative threshold state of cells becomes to be very small.

Figure 9A:
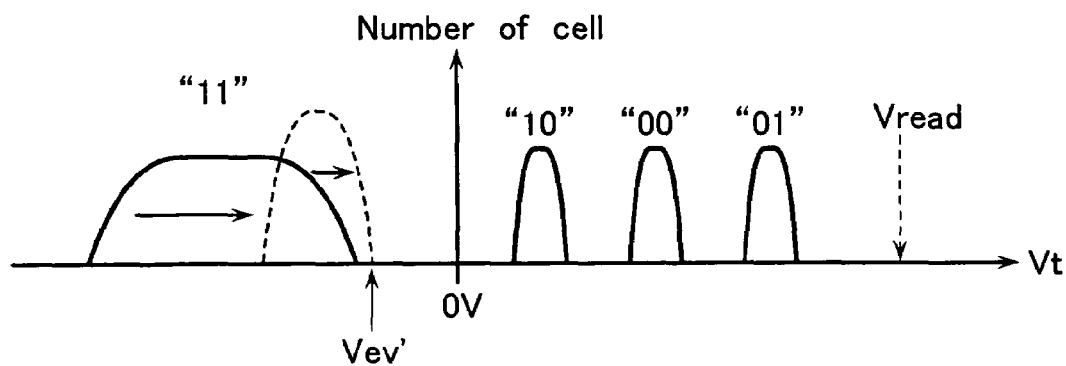
FIG. 9A shows 4-value data threshold distributions.

The above-described decrease of the verify margin leads to a large problem especially in a multi-value data storage. FIG. 9A shows threshold distributions of 4-value data of a 4-value data storing NAND flash memory. As shown in this drawing, performing two bits storage in a memory cell, 4-value data may be stored such as data "11" with a negative threshold, data "10", "00", and "01" each with a positive threshold.

In the above-described 4-value data storage, it is required of the erase state (data "11") to have a narrow distribution width as shown by dotted line in FIG. 9A due to circumstances of data write. For the purpose of this, weak write (i.e., soft write or program) is performed in succession to the conventional data erase. By use of such the scheme, it is possible to shift back the data threshold, which has been greatly shifted in the negative direction in the erase operation, in the positive direction. However, as a result of the soft write, the uppermost value of the data "11" threshold distribution becomes Vev' that is shifted in the positive direction from that of initially erased threshold distribution. Considering such the erase operation with soft write, it becomes more difficult to secure a large margin in the erase-verify.

Figure 7:
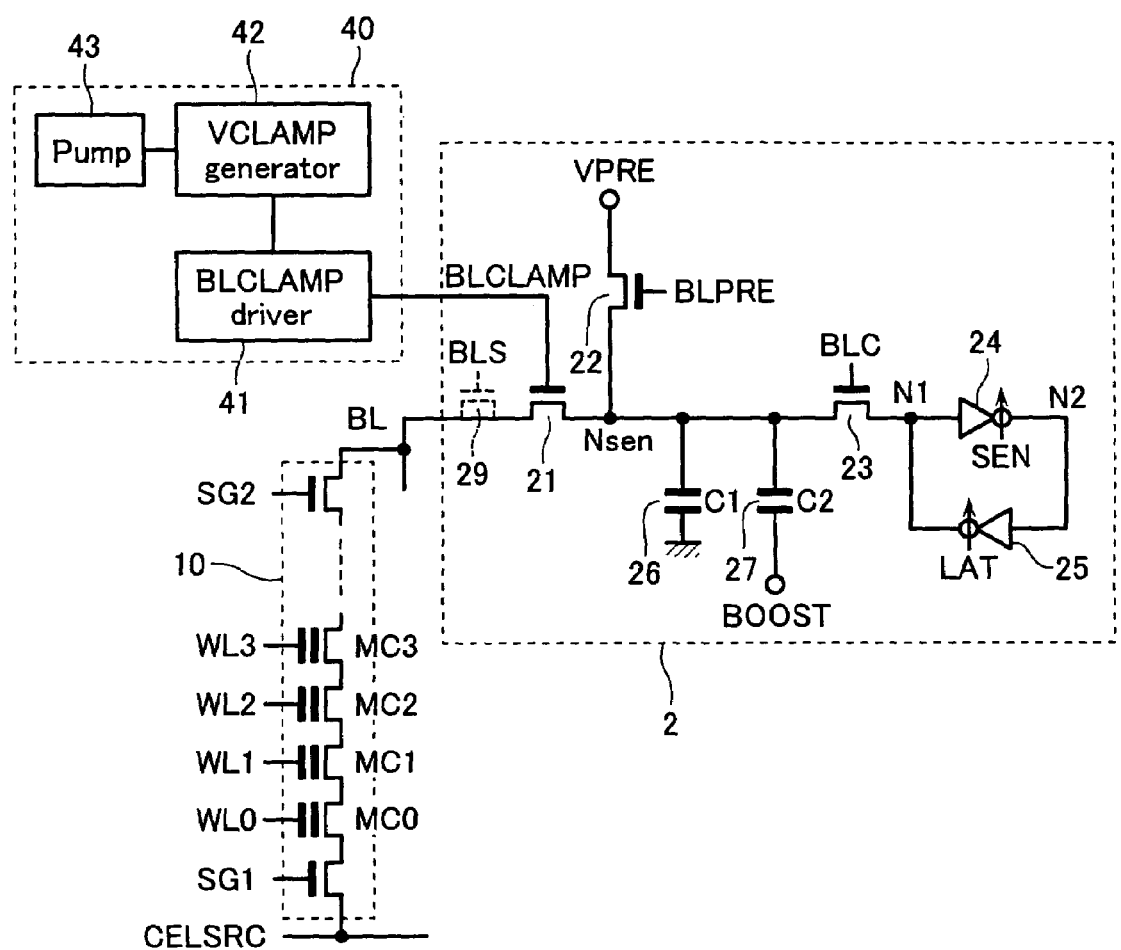
FIG. 7 shows main portions of a sense amplifier circuit in accordance with the embodiment.

In this embodiment, a sense amplifier circuit is configured in consideration of the above-described circumstances to secure a large margin in the erase-verify. FIG. 7 shows the sense amplifier 2 used in this embodiment in correspondence with the conventional type shown in FIG. 5. In FIG. 7, the same references designate the same components as in FIG. 5, and detailed explanation will be omitted.

A boost-use capacitor 27 is disposed for boosting the sense node Nsen at the bit line data sensing time, one end of which is coupled to the sense node Nsen. The other end thereof serves as a boost signal input node BOOST. In addition, a boost circuit (i.e., charge-pumping circuit) 43 is disposed in the clamp voltage generating circuit 40 for supplying a boosted voltage higher than the power supply voltage Vdd to the voltage generating circuit 42.

Figure 8:
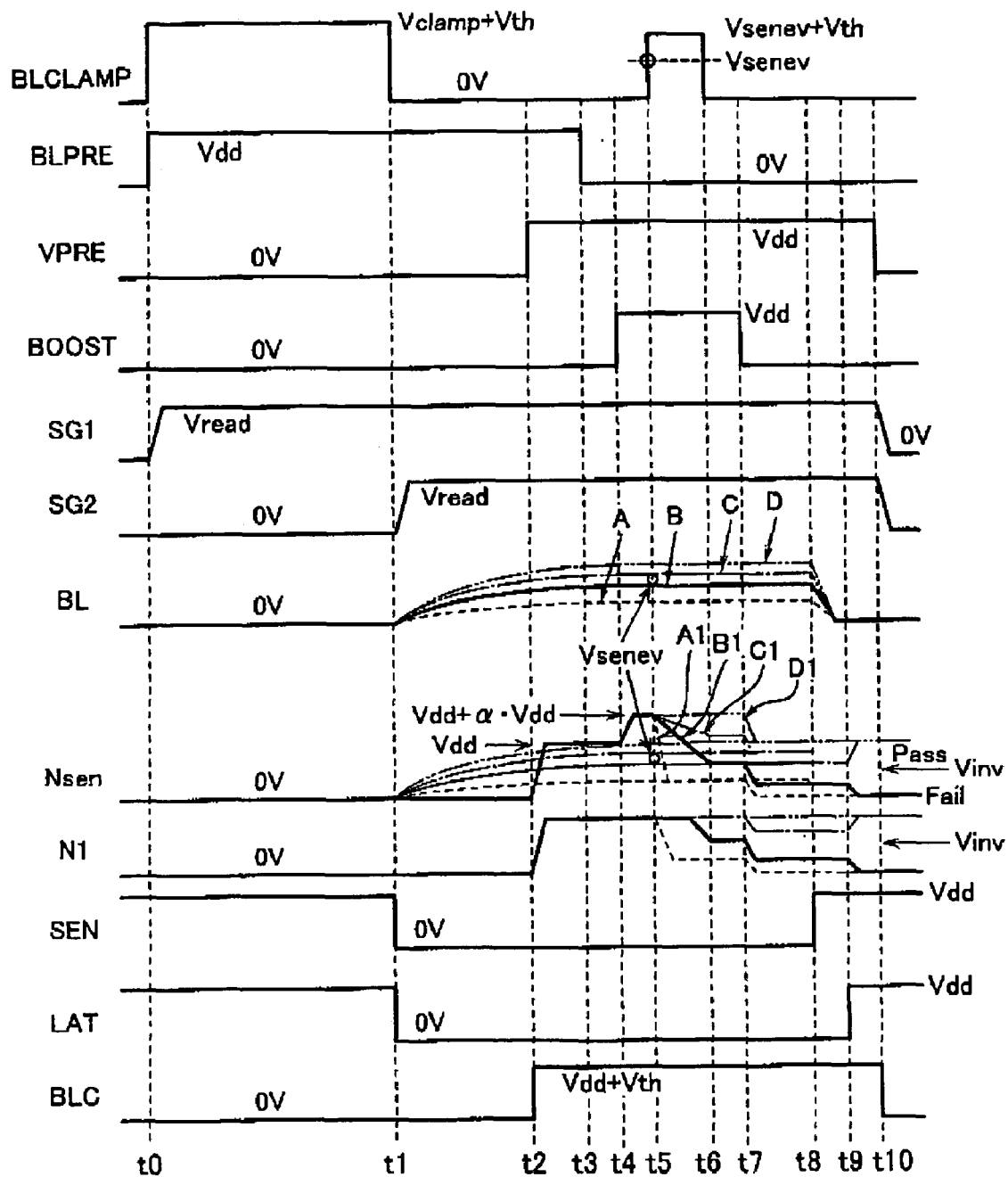
FIG. 8 shows a timing chart of an erase-verify operation with the sense amplifier circuit.

A timing chart of an erase-verify with the above-described sense amplifier circuit 2 is shown in FIG. 8 in correspondence with that shown in FIG. 6. The operations from timing t0 to timing t3 are the same as the case of FIG. 6. After turning off the precharge transistor 22 at timing t3, apply a positive voltage, for example, Vdd, to the input node BOOST at timing t4, and the sense node Nsen, which has been in a floating state of Vdd, is boosted with a coupling ratio determined by the capacitance C2 of the capacitor 27. Assume here that the boosted voltage of the sense node Nsen is Vdd+α·Vdd.

In a state that the sense node Nsen is boosted, apply the sense voltage Vsenev+Vth to the gate BLCLAMP of transistor 21 during timings t5–t6. In case that bit line voltage is lower than Vsenev as shown by curves A and B, the transistor 21 becomes on, whereby the sense node Nsen is discharged to be lower than Vsenev (refer to curves A1 and B1). As shown by curve C, in case that the bit line voltage is slightly higher than Vsenev, the transistor 21 is off. At this time, the voltage of the sense node Nsen is slightly lowered from Vdd+α·Vdd due to the sub-threshold current of the transistor 21 (refer to curve C1). In case that the bit line voltage is sufficiently high as shown by curve D, as the transistor 21 is held in a deeply-off state, the voltage of the sense node Nsen is hardly changed and held at Vdd+α·Vdd as it is (refer to curve D1).

After having turned off the transistor 21 at timing t6, step down the voltage of the sense node Nsen at timing t7. In detail, turn the boost node BOOST from Vdd to 0V, and the sense node Nsen, which is in a floating state, is stepped down in voltage by capacitive coupling of the capacitor 27. Hereinafter, as similar to the case of FIG. 6, activate the clocked inverters 24 and 25 at timing t8 and timing t9, respectively, and a judged data is latched as defined by the voltage level of the sense node Nsen.

Although the voltage of the sense node Nsen and data node N1 is approximately equal to Vsenev just after timing t6 in case that bit line voltage is slightly lower than Vsenev as shown by curve B, these nodes are stepped down in voltage to be surely lower than the inverting threshold Vinv of the clocked inverter 24 due to the voltage step-down operation by the capacitor 27 at timing t7. Therefore, even if the inverting threshold Vinv has been lowered due to lowering of the power supply voltage Vdd, it is possible to set Vsenev as higher than Vinv.

In other words, appropriately setting the capacitive coupling ratio of the boost capacitor 27 to the sense node Nsen, it is not required to lower the sense voltage applied to the gate BLCLAMP of the clamping transistor 21 in case that the inverting threshold voltage of the clocked inverter 24 has been lowered. Further explaining in other words, even if the power supply voltage Vdd is lowered, it is possible to set the erase-verify use judging value Vsenev (=|Vev|) as being approximately equal to the conventional value, or set it free. For example, assume that the uppermost value of "11" data threshold is Vev as shown in FIG. 2, and it is possible to secure an uppermost value Vev' as lower than Vev by use of the sense amplifier circuit shown in FIG. 7.

Note here, in case the erase-verify is passed as a result of that bit line voltage is higher than the judging value Vsenev as shown by curve C or D, the sense node Nsen, which has been set at Vdd+α·Vdd at timing t4, merely turns to be approximately equal to Vdd at timing t7. Therefore, it is possible to increase the voltage difference between "H" and "L" levels at the sense node Nsen and data node N1 after bit line data sensing during timings t5–t6. In other words, a large amplification effect may be obtained at the bit line data sensing time.

To lower the "L" level voltage of the sense node Nsen after bit line data sensing, another method may be used as to step down the voltage of the node BOOST in the negative direction at timing t7 without applying a positive voltage to the boost capacitor 27. In this method, however, the sense node Nsen becomes Vdd–α·Vdd in case that the erase-verify should be passed, and becomes Vsenev–α·Vdd in case that erase-verify should be failed. Therefore, the difference between "H" and "L" levels at the sense node Nsen becomes as (Vdd–α·Vdd)–(Vsenev–α·Vdd)=Vdd–Vsenev.

By contrast to this, by use of both of boosting and stepping down the sense node Nsen as in this embodiment, it is possible to make the difference between "H" and "L" levels at the sense node Nsen larger than that in the above-described case. In detail, the sense node Nsen becomes Vdd in case the erase-verify is passed, and becomes Vsenev–α·Vdd in case the erase-verify is failed. Therefore, the difference between "H" and "L" levels at the sense node Nsen becomes as Vdd–(Vsenev–α·Vdd)=Vdd–Vsenev+α·Vdd. Although such an object as to make the judging value Vsenev higher than the inverting threshold voltage Vinv of the clocked inverter may be achieved by use of only voltage stepping down of the sense node, this results in that a voltage range as being sensed as an "H" input by the clocked inverter 24 becomes small.

Next, a method of generating the verify-judging value Vsenev will be described below. The sense-use voltage, which is applied to the gate BLCLAMP of transistor 21 during timings t5 to t6, is Vsenev+Vth, and this is generated from the voltage generating circuit 42. Since the threshold voltage Vth is about 1.5V in consideration of the substrate bias effect on the assumption of Vsenev=1V, it is required of the voltage generating circuit 42 to have a power supply voltage of about 2.5V. Therefore, in case that the power supply voltage is set at 1.8V, it is difficult to achieve a desirable erase-verify operation without boosting the power supply node of the voltage generating circuit 42. In consideration of the above-described situation, it is prepared the boost circuit 43 for generating a boosted voltage of about 3V. However, it should be appreciated that, in some cases, desirable voltage boosting and voltage stepping-down may be done only by controlling the voltage amplitude of the node BOOST of the capacitor 27 without the boost circuit 43.

As described above, use the sense amplifier circuit in accordance with this embodiment, and it is possible to do an erase-verify operation with a sufficiently large erase margin settable without regard to the power supply voltage reduction. Especially, this embodiment is advantageous in case that multi-value data storage is performed as explained by use of FIG. 9A. This point will be explained in detail below.

In the 4-value data storage scheme, as described above, it is necessary to perform an erase operation and a soft-write operation thereafter for controlling the threshold distribution of the erased state of data "11". In detail, the erase operation and soft-write operation thereafter in this embodiment will be explained referring to FIGS. 9B and 9C. In each of FIGS. 9B and 9C, only the threshold distributions of data "11" (erased state) are shown by a solid line (after erasing) and a dotted line (after soft-writing).

With respect to the erase-verify, using the sense amplifier circuit 2 shown in FIG. 7, it is possible to lower the uppermost value Vev of data "11" in spite of the power supply voltage reduction. With respect to the soft write-verify, two schemes may be used as follows: one is to define the threshold uppermost value Vsp as shown by the dotted line in FIG. 9B; and the other is to define the lowermost value Vsv as shown by the dotted line in FIG. 9C.

Figure 9B:
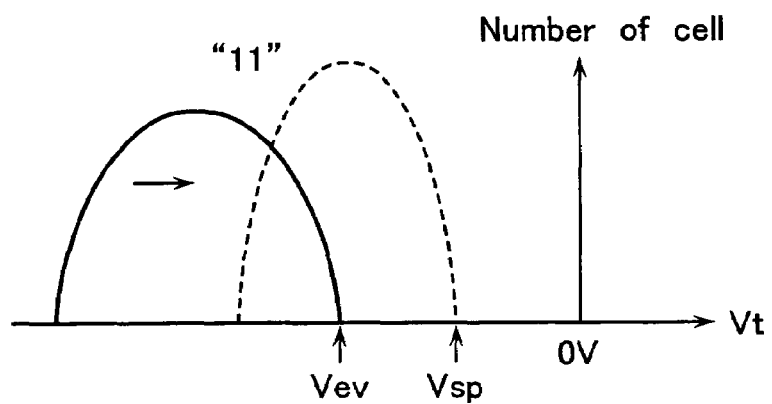
FIG. 9B is a diagram for explaining an erase-verify method for data "11" in 4-value data storage.

In the soft write-verify shown in FIG. 9B, suppose that the cell current is carried from the source line to the bit line with applying 0V to the entire word lines in a selected block as similar to that in case of the binary data storage as described above. In this case, the sense-use voltage Vsenev+Vth applied to the gate BLCLAMP of transistor 21 is selected as Vsenev=|Vsp|. And detecting that the bit line voltage has been lower than Vsenev with respect to at least one NAND cell unit (for example, a few NAND cell units), it is judged "PASS". In other words, "PASS" is judged on condition that a little over-write unit cells have been detected, threshold of which is higher than the uppermost value Vsp. As a result, it is possible to set the uppermost value of the threshold distribution of data "11" as being Vsp.

Figure 9C:
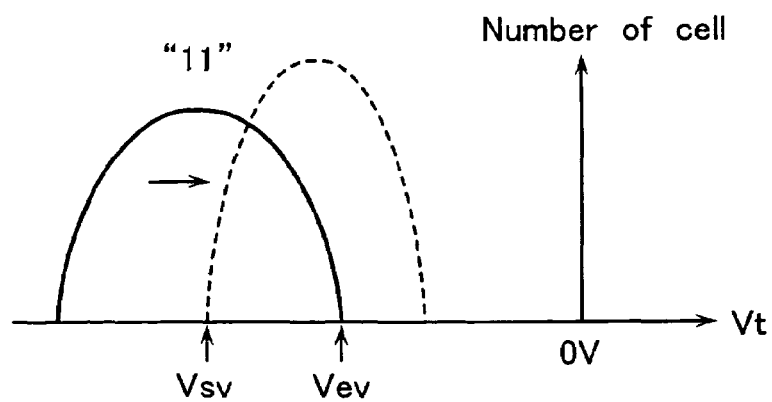
FIG. 9C id a diagram for explaining another erase-verify method for data "11" in 4-value data storage.

In the soft write-verify shown in FIG. 9C, suppose that the cell current is carried from the source line to the bit line with applying 0V to the entire word lines in a selected block as similar to that in case of the binary data storage as described above. In this case, the sense-use voltage Vsenev+Vth applied to the gate BLCLAMP of transistor 21 is selected as Vsenev=|Vsv|. And detecting that the bit line voltage has been lower than Vsenev with respect to the entire NAND cell units in the selected block, it is judged "PASS". As a result, it is possible to secure that the lowermost value of the threshold distribution of data "11" is Vsv. This scheme is effective in case that a plurality of soft program operations are repeated while suppressing a threshold change at each soft program within a small voltage range. This is, in such the soft write, it hardly occurs to shift large the uppermost of the threshold voltage in the positive direction.

As described above, even if the power supply voltage is reduced, utilizing the sense amplifier circuit in accordance with this embodiment, it is possible to control the memory cell' threshold voltage to be negative with a large absolute value. Therefore, it is able to secure a large sense margin not only in the erase-verify as described above, but also in the soft write-verify after erasing.

Although, 0V is applied to the entire word lines in the selected block in the example of the erase-verify and soft write-verify as described above, it is possible to apply another read voltage Vw with an appropriate value to the word lines. In such case, the bit line voltage ideally becomes Vw–Vt (Vt: memory cell' threshold voltage). On the other hand, it is necessary in the soft write for permitting that the uppermost value of the negative threshold is shifted not a little in the positive direction. Therefore, the read voltage Vw becomes as a permissible threshold shift. In this case, the sense-use voltage applied to the gate BLCLAMP of transistor 21 at the bit line data sensing time may be set at Vsenev+Vth (Vth: clamping transistor's threshold voltage) as similar to that of the above example.

Figure 10:
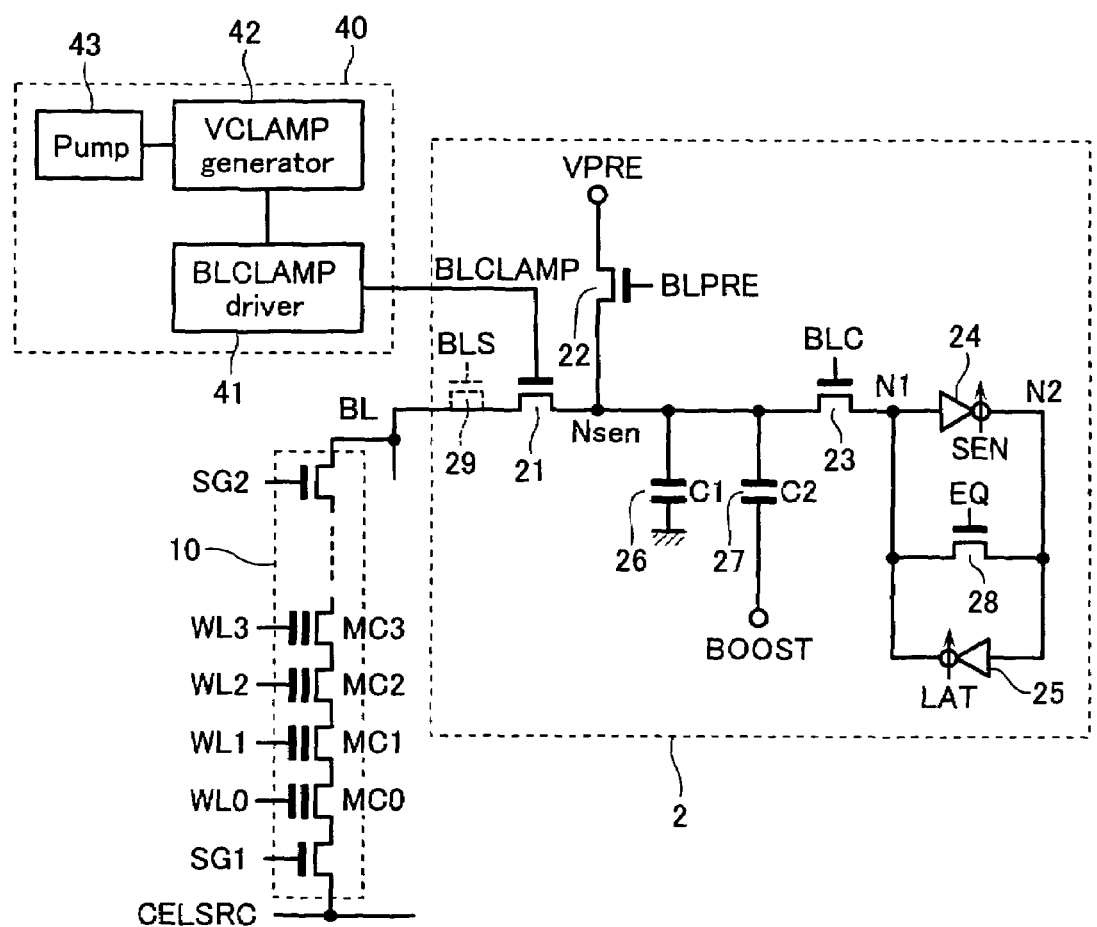
FIG. 10 shows a configuration of a sense amplifier circuit in accordance with another embodiment.
Figure 11:
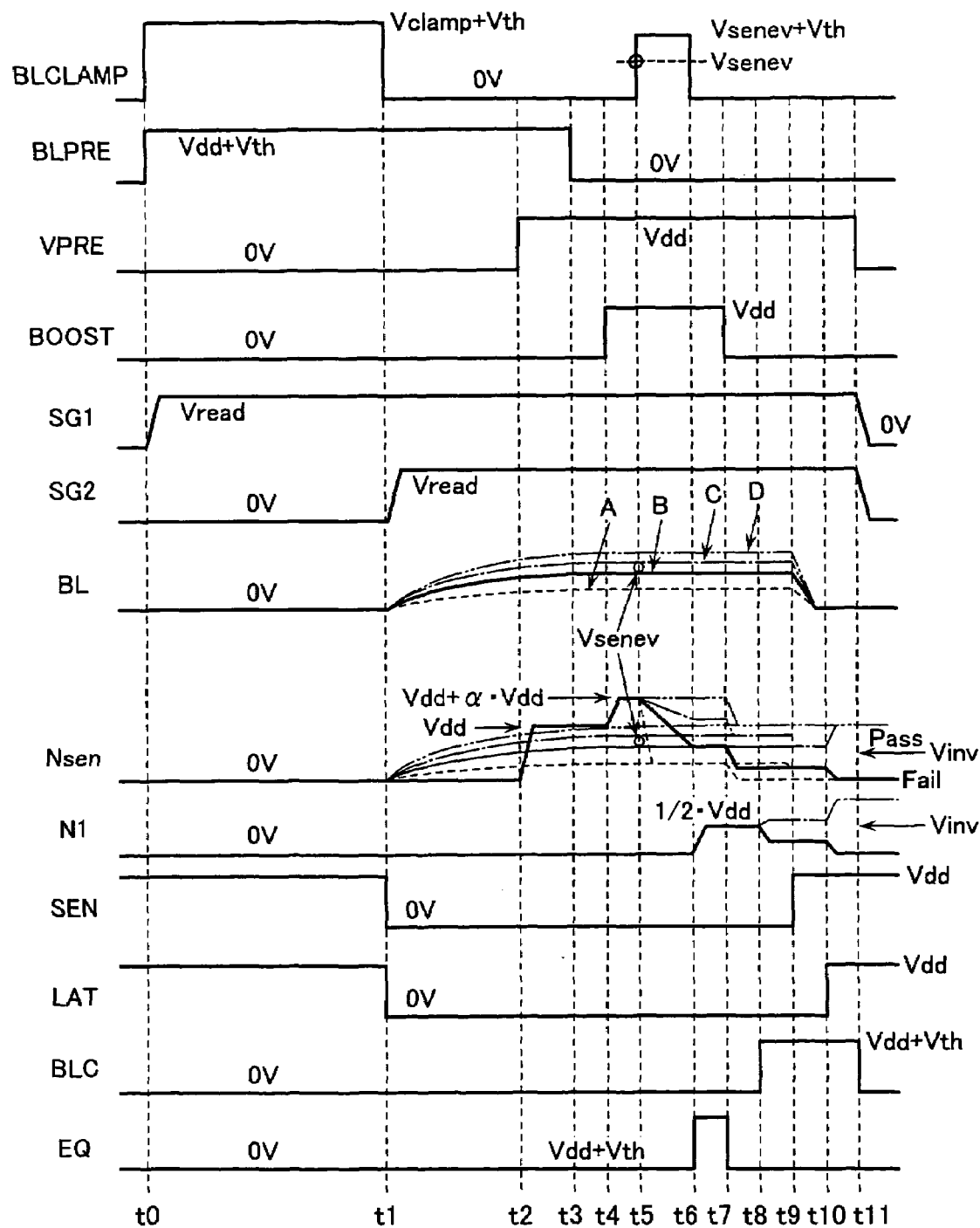
FIG. 11 shows a timing chart of an erase-verify operation with the sense amplifier circuit.

FIG. 10 shows another embodiment in which the sense amplifier circuit 2 is improved in part. In this embodiment, an equalizing NMOS transistor 28 is additionally disposed between the data nodes N1 and N2 of the latch circuit composed of the clocked inverters 24 and 25. Operation waveforms of the erase-verify with this sense amplifier circuit 2 are shown in FIG. 11 in comparison with those shown in FIG. 8.

While the sense node Nsen and data node N1 are simultaneously boosted by the boost capacitor 27 in the above described embodiment, a boost portion is limited to the sense node Nsen only in this embodiment. The gate BLC of transferring transistor 23 is held at 0V until timing t8 after having finished the bit line data sensing by the transistor 21. Until timing t8, the data node N1 is electrically isolated from the sense node Nsen. In such the state, only the sense node Nsen is boosted (at timing t4), and then the transistor 21 is turned on to transfer the bit line data to the sense node Nsen (from timing t5 to timing t6). Thereafter, the sense node Nsen is stepped down in voltage (at timing t7).

According to this embodiment, there is obtained an advantageous effect that the voltage of the sense node Nsen with the capacitor 27 may be more precisely controlled. In detail, when driving the capacitor 27 at timing t4 in the above-described embodiment, the transistor 23 becomes off. Therefore, only the sense node Nsen is boosted with a coupling ratio with the parasitic capacitance of the data node N1 as being hardly added. And when the voltage of the sense node Nsen is stepped down at timing t7, in case that the sense node Nsen and data node N1 is lower than Vdd, the voltage step down is done with a coupling ratio with the parasitic capacitance of the data node N1 as being added. If capacitances C1 and C2 of the capacitors 26 and 27 are sufficiently large in comparison with the stray capacitances of the sense node Nsen and data node N1, the voltage amplitudes of the boosting and voltage stepping down become nearly equal to each other. However, since the sense amplifiers in the NAND flash memory are prepared in communication with the respective bit lines simultaneously accessed, it is desired in consideration of the sense amplifier layout to lessen the capacitances C1 and C2 of the capacitors 26 and 27 to have necessary and minimum values. In such case that the capacitors 26 and 27 must be disposed within a small area, it is effective that the boosting and voltage stepping down operations are limited only to the sense node Nsen as in this embodiment.

Further in this embodiment, prior to latching the sensed data of the sense node Nsen, rise up an equalizing signal EQ at timing t6 to turn on the transistor 28, and the data nodes N1 and N2 are equalized to be Vdd/2. With such equalizing, when the sensed data of the sense node Nsen is latched in the data node N1, it is not influenced by the history of the data node N1. In detail, without regard to whichever the data held in the data latch is "H" or "L" before the erase-verify operation, it is possible to always set the data node N1 at the same state when latching the sensed data of the sense node Nsen after bit line data sensing.

Figure 12:
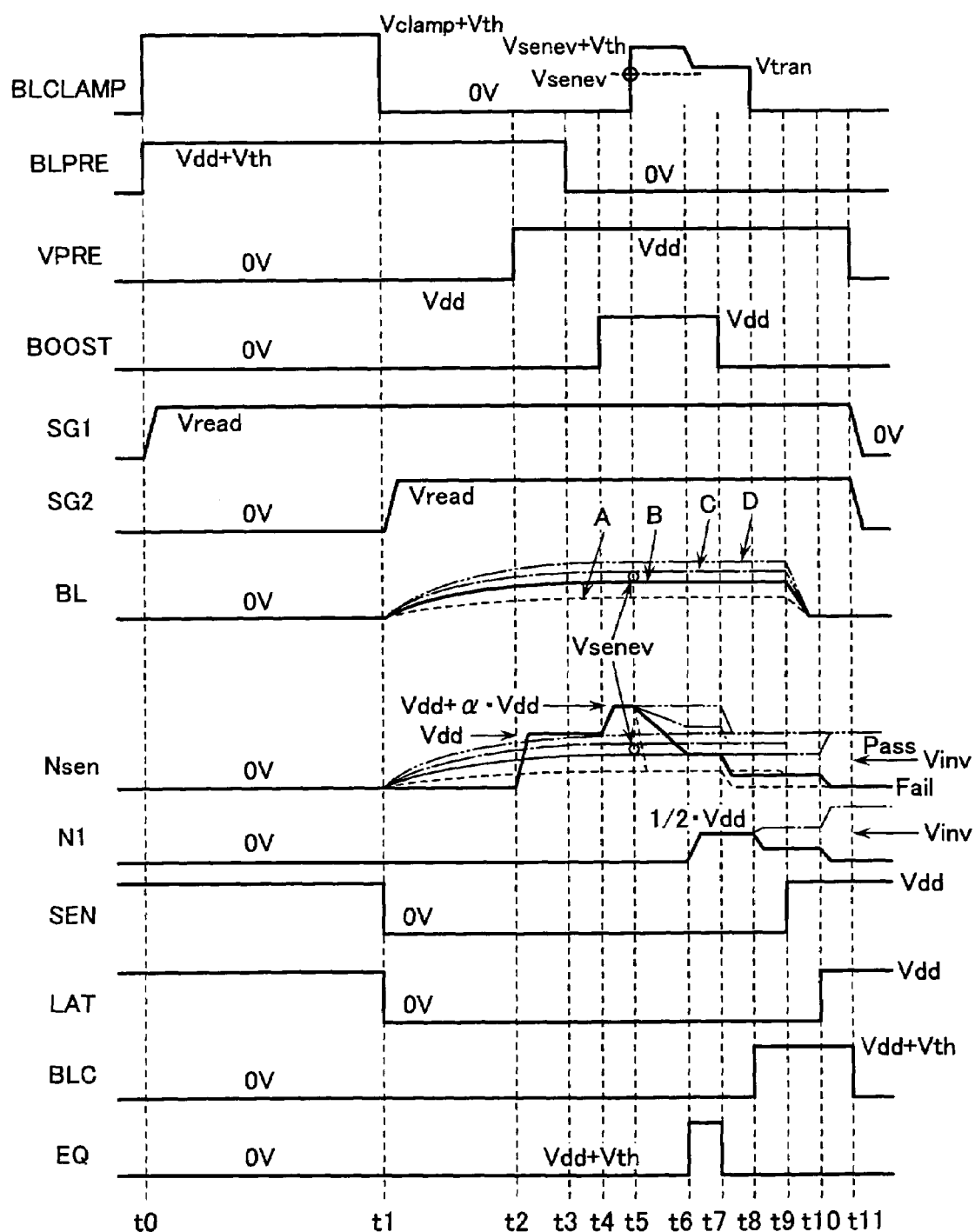
FIG. 12 shows a timing chart of another erase-verify operation with the sense amplifier circuit.

FIG. 12 shows operation waveforms in accordance with still another embodiment, which are improved in part in comparison with those in FIG. 11. In the erase-verify operation as explained in FIG. 8 or 11, when the sense node Nsen and data node N1 are stepped down in voltage by use of the capacitor 27, the source/drain junction of the clamping transistor 21 may be forward-biased in correspondence with sensed data. For example, in case that the threshold voltage of the erased memory cell is positive (i.e., insufficient erase state), the bit line is not charged after timing t1, resulting in that the sense node Nsen and data node N1 become to be about 0V after bit line voltage sensing during timings t5–t6. When the boost voltage applied to the capacitor 27 is removed in such the state, the sense node Nsen and data node N1 swing to be a negative voltage by capacitive coupling.

In FIG. 12, to prevent such the accident, a gate voltage Vtran is applied to the transistor 21 during timings t6–t8 after bit line data sensing. The voltage Vtran is set as to keep the transistor 21 to be in a shallow on-state. With such gate voltage application, when the sense node Nsen is going to be lower than 0V at the boost operation stopping timing t7, bit line charge is transferred to the sense node Nsen. Therefore, the sense node Nsen is prevented from becoming negative. Even if the bit line is held at about 0V, the capacitors 26 and 27 being sufficiently small in capacitance in comparison with the bit line capacitance, the sense node voltage reduction may be prevented or suppressed by the above-described charge transferring.

As an embodiment, an electric card using the non-volatile semiconductor memory devices according to the above-described embodiments of the present invention and an electric device using the card will be described below.

Figure 13:
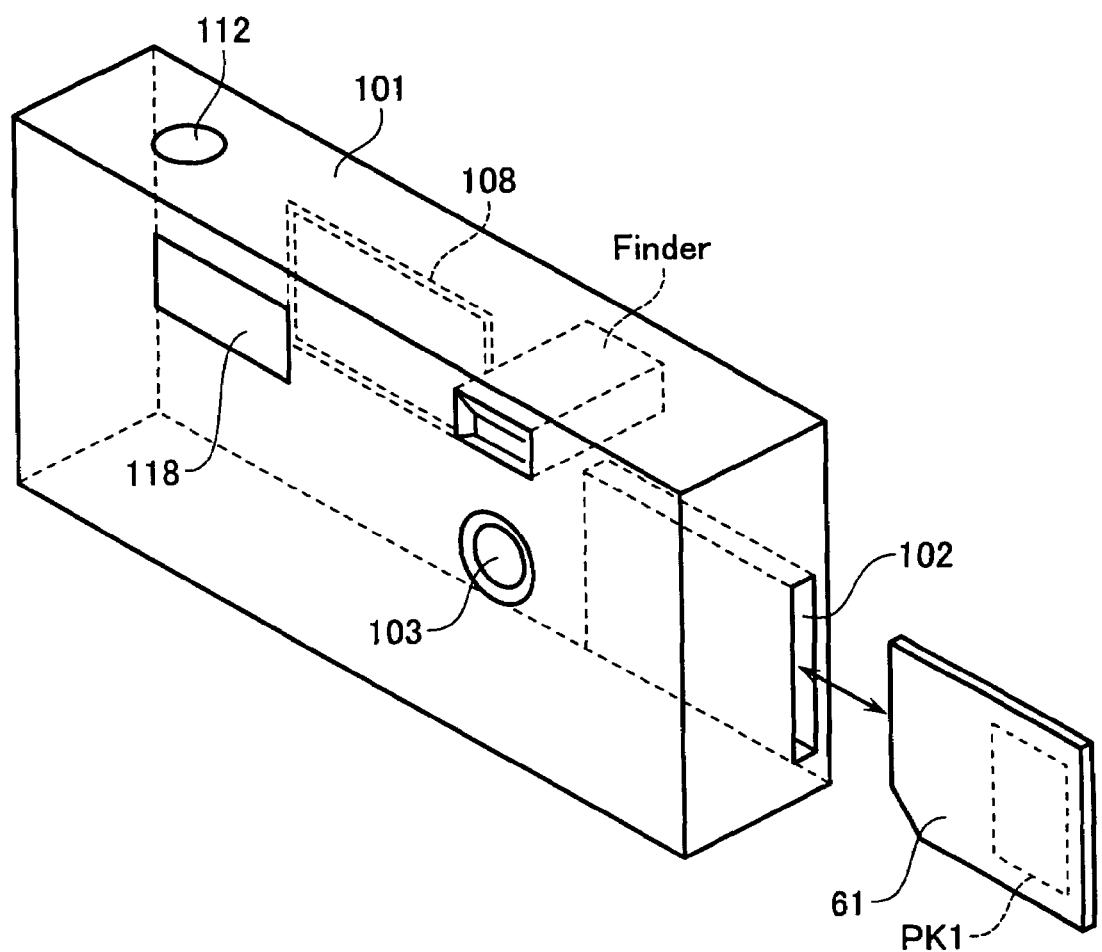
FIG. 13 shows an embodiment applied to a digital still camera.

FIG. 13 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 14:
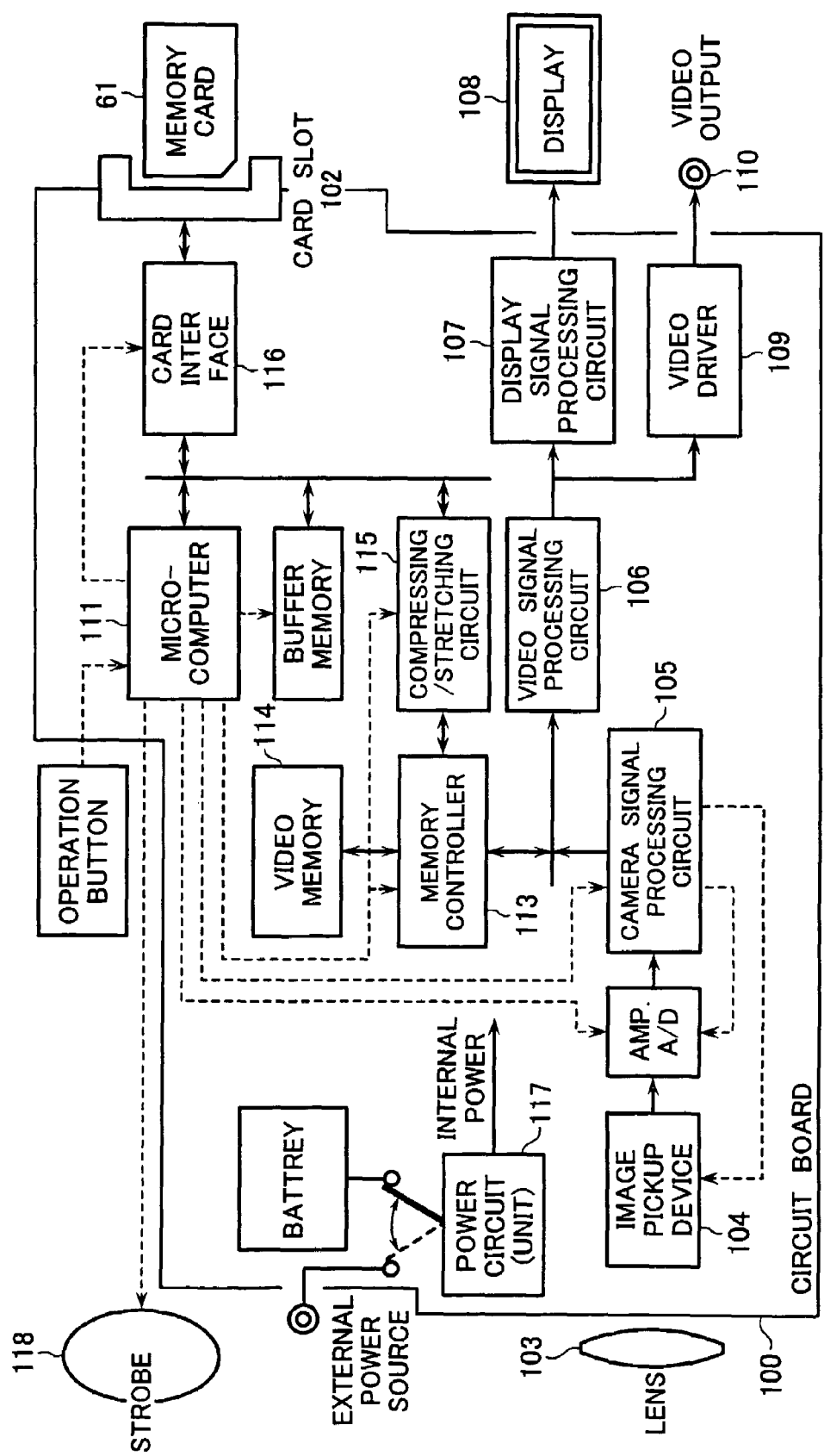
FIG. 14 shows an internal configuration of the digital still camera.
Figure 15A:
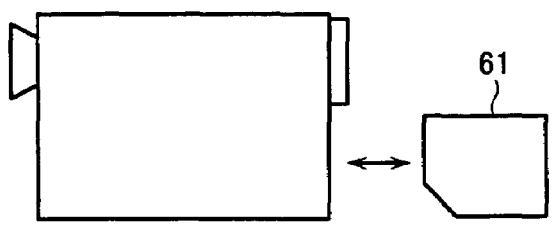
FIGS. 15A to 15J show other embodiments applied to various electric devices.
Figure 15F:
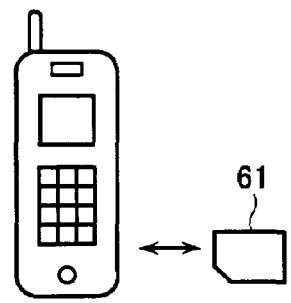
Figure 15B:
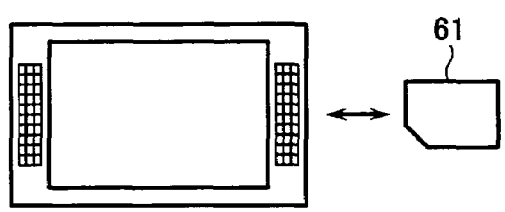
Figure 15G:
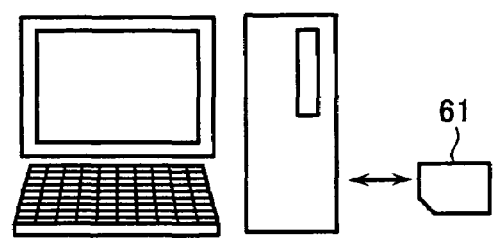
Figure 15C:
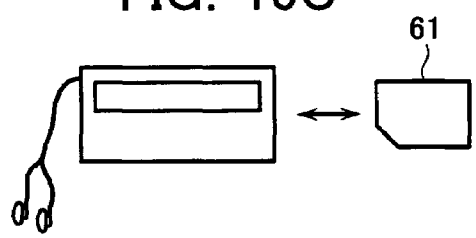
Figure 15H:
Figure 15D:
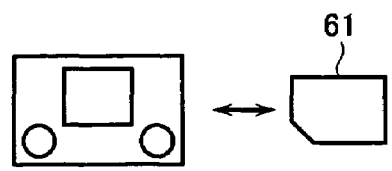
Figure 15I:
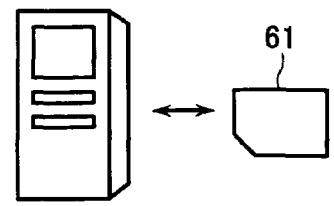
Figure 15E:
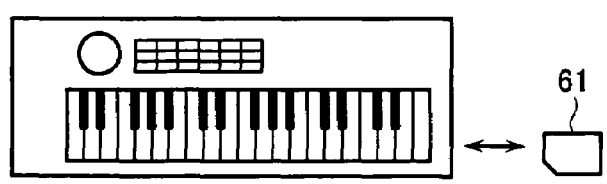
Figure 15J:
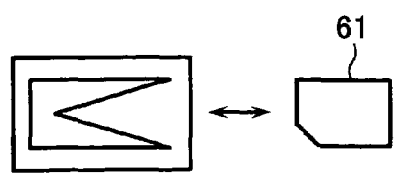

FIG. 14 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a frame image. The frame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 15A to 15J, as well as in portable electric devices. That is, the electric card can also be used in a video camera shown in FIG. 15A, a television set shown in FIG. 15B, an audio apparatus shown in FIG. 15C, a game apparatus shown in FIG. 15D, an electric musical instrument shown in FIG. 15E, a cell phone shown in FIG. 15F, a personal computer shown in FIG. 15G, a personal digital assistant (PDA) shown in FIG. 15H, a voice recorder shown in FIG. 15I, and a PC card shown in FIG. 15J.

This invention is not limited to the above-described embodiment. It will be understood by those skilled in the art that various changes in form and detail may be made without departing from the spirit, scope, and teaching of the invention.

What is claimed is:

1. A non-volatile semiconductor memory device comprising a memory cell array with electrically rewritable and non-volatile memory cells arranged therein, and a sense amplifier circuit for reading said memory cell array, wherein said sense amplifier circuit comprises:
   a first transistor disposed between a bit line of said memory cell array and a sense node to serve for sensing bit line data, said first transistor being driven by a voltage generating circuit including a boost circuit to transfer a bit line voltage determined in response to data of a selected memory cell to said sense node;
   a second transistor coupled to said sense node for precharging said sense node prior to bit line data sensing;
   a data latch for judging a transferred bit line voltage level to store a sensed data therein; and
   a capacitor for boosting said sense node, one end thereof being connected to said sense node, the other end thereof being alternatively given a first voltage and a second voltage higher than the first voltage.

2. The non-volatile semiconductor memory device according to claim 1, wherein
   in an erase-verify read operation for verifying an erased state of selected memory cells in said memory cell array, said sense amplifier circuit transfers a bit line voltage to said sense node in a state that a sense-use voltage is applied to said first transistor and said sense node is boosted by said capacitor.

3. The non-volatile semiconductor memory device according to claim 1, wherein
   said data latch comprises:
   first and second data nodes, said first data node being connected to said sense node;
   a first clocked inverter, input and output nodes of which are coupled to said first and second data node, respectively; and
   a second clocked inverter, input and output nodes of which are coupled to said second and first data nodes, respectively.

4. The non-volatile semiconductor memory device according to claim 3, wherein
   said sense amplifier circuit further comprises a third transistor disposed between said sense node and said first data node for transferring a voltage at said sense node to said first data node.

5. The non-volatile semiconductor memory device according to claim 4, wherein
   said sense amplifier circuit further comprises a fourth transistor disposed between said first and second data nodes for equalizing these nodes.

6. The non-volatile semiconductor memory device according to claim 4, wherein
   said third transistor is on-driven from the beginning of said sense node precharging by said second transistor until said data latch stores a sensed data.

7. The non-volatile semiconductor memory device according to claim 5, wherein
   said third transistor is held in an off-state while said first transistor is sensing a bit line data, and driven to turn on after said data latch has been equalized by said fourth transistor.

8. The non-volatile semiconductor memory device according to claim 5, wherein
   said first transistor is driven to be in a shallow on-state after bit line data sensing until the boost-use voltage applied to said capacitor is removed.

9. The non-volatile semiconductor memory device according to claim 1, wherein
   said memory cell array has NAND cell units arranged therein, each NAND cell unit having plural memory cells connected in series, one end of each NAND cell unit being connected to a corresponding bit line and the other end to a source line, control gates in each NAND cell unit being connected to different word lines.

10. The non-volatile semiconductor memory device according to claim 9, wherein
    a data erase mode of said memory cell array includes an erase operation with applying an erase voltage to selected memory cells to shift threshold voltages thereof to be negative; and an erase-verify operation for verifying an erased state of the selected memory cells after said erase operation in such a manner as to sense a bit line voltage change due to cell current of the selected memory cells by said sense amplifier circuit on condition that a verify-read voltage is applied to said selected memory cells, and a voltage equal to or less than a power supply voltage to said source line.

11. The non-volatile semiconductor memory device according to claim 10, wherein
    said erase operation is done by a block defined as a group of NAND cell units sharing a word line as to release electrons stored in floating gate of the entire memory cells in a selected block on condition that 0V is applied to the entire word lines in the selected block, and a positive erase voltage to a semiconductor well on which said memory cell array is formed; and wherein said erase-verify operation is done by detecting a bit line voltage with each sense amplifier, said bit line being charged by the selected memory cells on condition that 0V is applied to the entire word lines in said selected block, and a voltage equal to or less than power supply voltage to said source line.

12. An electric card equipped with a non-volatile semiconductor memory device defined in claim 1.

13. An electric device comprising:
a card interface;
a card slot connected to said card interface; and
an electric card defined in claim 12 and electrically connectable to said card slot.

14. A non-volatile semiconductor memory device comprising a memory cell array with electrically rewritable and non-volatile memory cells arranged therein, and a sense amplifier circuit for reading said memory cell array, wherein said sense amplifier circuit comprises:
a first transistor disposed between a bit line of said memory cell array and a sense node to serve for sensing bit line data and transferring a bit line voltage determined in response to data of a selected memory cell to said sense node;
a second transistor coupled to said sense node for precharging said sense node prior to bit line data sensing;
a data latch for judging a transferred bit line voltage level to store a sensed data therein; and
a capacitor for boosting said sense node, one end thereof being connected to said sense node, the other end thereof being alternatively given a first voltage and a second voltage higher than the first voltage, and wherein
in an erase-verify read operation for verifying an erased state of selected memory cells in said memory cell array, said sense amplifier circuit transfers a bit line voltage to said sense node in a state that a sense-use voltage is applied to said first transistor and said sense node is boosted by said capacitor.

15. The non-volatile semiconductor memory device according to claim 14, wherein
a gate of said first transistor is driven by a voltage generating circuit including a boost circuit.

16. The non-volatile semiconductor memory device according to claim 14, wherein
said data latch comprises:
first and second data nodes, said first data node being connected to said sense node;
a first clocked inverter, input and output nodes of which are coupled to said first and second data node, respectively; and
a second clocked inverter, input and output nodes of which are coupled to said second and first data nodes, respectively.

17. The non-volatile semiconductor memory device according to claim 16, wherein
said sense amplifier circuit further comprises a third transistor disposed between said sense node and said first data node for transferring a voltage at said sense node to said first data node.

18. The non-volatile semiconductor memory device according to claim 17, wherein
said sense amplifier circuit further comprises a fourth transistor disposed between said first and second data nodes for equalizing these nodes.

19. The non-volatile semiconductor memory device according to claim 17, wherein said third transistor is on-driven from the beginning of said sense node precharging by said second transistor until said data latch stores a sensed data.

20. The non-volatile semiconductor memory device according to claim 18, wherein
said third transistor is held in an off-state while said first transistor is sensing a bit line data, and driven to turn on after said data latch has been equalized by said fourth transistor.

21. The non-volatile semiconductor memory device according to claim 14, wherein
said first transistor is driven to be in a shallow on-state after bit line data sensing until the boost-use voltage applied to said capacitor is removed.

22. The non-volatile semiconductor memory device according to claim 14, wherein
said memory cell array has NAND cell units arranged therein, each NAND cell unit having plural memory cells connected in series, one end of each NAND cell unit being connected to a corresponding bit line and the other end to a source line, control gates in each NAND cell unit being connected to different word lines.

23. The non-volatile semiconductor memory device according to claim 22, wherein
a data erase mode of said memory cell array includes an erase operation with applying an erase voltage to selected memory cells to shift threshold voltages thereof to be negative; and an erase-verify operation for verifying an erased state of the selected memory cells after said erase operation in such a manner as to sense a bit line voltage change due to cell current of the selected memory cells by said sense amplifier circuit on condition that a verify-read voltage is applied to said selected memory cells, and a voltage equal to or less than a power supply voltage to said source line.

24. The non-volatile semiconductor memory device according to claim 23, wherein
said erase operation is done by a block defined as a group of NAND cell units sharing a word line as to release electrons stored in floating gates of the entire memory cells in a selected block on condition that 0V is applied to the entire word lines in the selected block, and a positive erase voltage to a semiconductor well on which said memory cell array is formed; and wherein
said erase-verify operation is done by detecting a bit line voltage with each sense amplifier, said bit line being charged by the selected memory cells on condition that 0V is applied to the entire word lines in said selected block, and a voltage equal to or less than a power supply voltage to said source line.

25. An electric card equipped with a non-volatile semiconductor memory device defined in claim 14.

26. An electric device comprising:
a card interface;
a card slot connected to said card interface; and
an electric card defined in claim 25, and electrically connectable to said card slot.

27. The non-volatile semiconductor memory device according to claim 1, wherein said second voltage is a power supply voltage.

28. The non-volatile semiconductor memory device according to claim 14, wherein said second voltage is a power supply voltage.

* * * * *